United States Patent [19]
Merrill

[11] Patent Number: 5,982,012
[45] Date of Patent: Nov. 9, 1999

[54] PIXEL CELLS AND PIXEL CELL ARRAYS HAVING LOW LEAKAGE AND IMPROVED PERFORMANCE CHARACTERISTICS

[75] Inventor: Richard B. Merrill, Woodside, Calif.

[73] Assignee: Foveon, Inc., Santa Clara, Calif.

[21] Appl. No.: 09/006,779

[22] Filed: Jan. 14, 1998

[51] Int. Cl.[6] .................................................. H01L 31/00
[52] U.S. Cl. ........................ 257/463; 257/464; 257/566
[58] Field of Search .................................. 257/461, 462, 257/463, 464, 466, 566, 561, 562

[56] References Cited

U.S. PATENT DOCUMENTS

| | | | |
|---|---|---|---|
| 3,798,512 | 3/1974 | Critchlow et al. | 317/235 |
| 4,154,873 | 5/1979 | Hickox et al. | 427/82 |
| 4,320,409 | 3/1982 | Shoji | 357/42 |
| 4,380,021 | 4/1983 | Matsuyama et al. | 357/15 |
| 4,412,375 | 11/1983 | Matthews | 29/571 |
| 4,447,290 | 5/1984 | Matthews | 156/626 |
| 4,468,852 | 9/1984 | Cerofolini | 29/571 |
| 5,309,013 | 5/1994 | Suzuki et al. | 257/462 |
| 5,324,958 | 6/1994 | Mead et al. | 257/291 |
| 5,763,909 | 6/1998 | Mead et al. | 257/462 |

*Primary Examiner*—Donald L. Monin, Jr.
*Attorney, Agent, or Firm*—Limbach & Limbach L.L.P.

[57] ABSTRACT

The present invention relates to a pixel cell and pixel cell array modified to improve performance. One improvement taught by the present invention is implantation of dopant into the silicon to form the base region after formation of polysilicon, resulting in highest base dopant concentrations lying at the thin oxide and emitter interfaces. A second improvement taught by the present invention is a reduction in the size of the heavily doped portion of the emitter to extend no further than the footprint of the emitter contact, thereby inhibiting leakage between the emitter and adjacent polysilicon. A third improvement taught by the present invention is electronic isolation of pixel cells by inter-pixel regions doped with conductivity-altering impurity of a type opposite that of the base rather than by field oxides, thereby eliminating leakage at the field oxide edge. A fourth improvement disclosed by the present invention is the introduction of silicides at the emitter contact and the base capacitor contact in order to reduce contact resistance.

10 Claims, 8 Drawing Sheets

PIXEL CELLS AND PIXEL CELL ARRAYS HAVING LOW LEAKAGE AND IMPROVED PERFORMANCE CHARACTERISTICS

BACKGROUND OF THE INVENTION

1. Field of the Invention

The present invention relates to pixel cell structures and pixel cell arrays, and more particularly, to pixel cells and pixel cell arrays having improved leakage and performance characteristics.

2. Description of the Related Art

Figure 1:
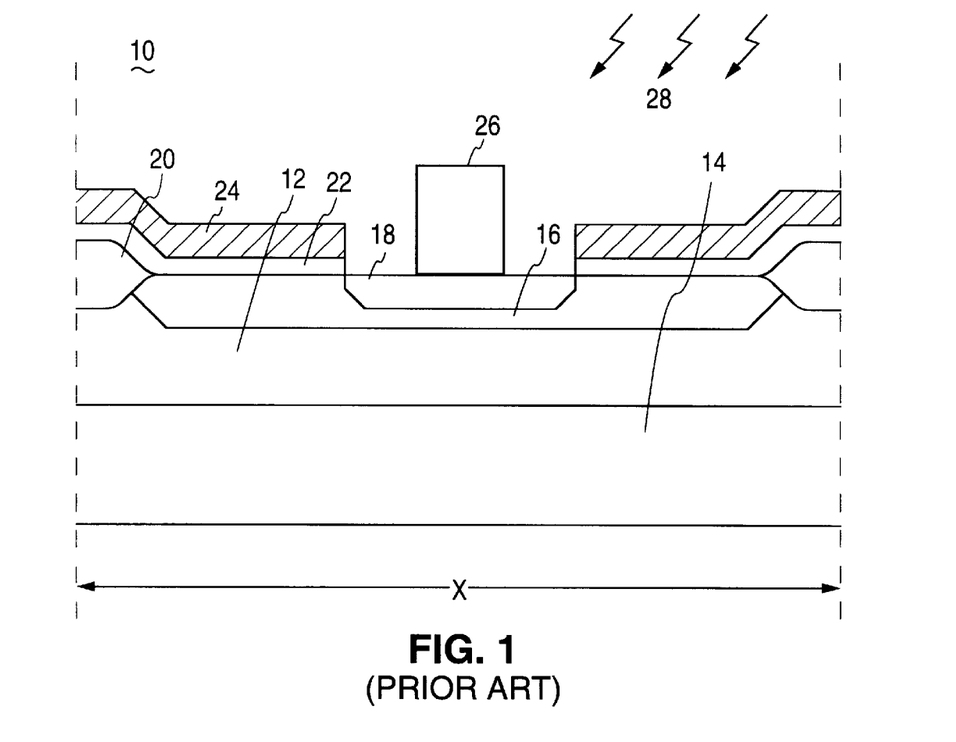
FIG. 1 shows a cross-sectional view of a conventional NPN bipolar phototransistor pixel cell.

Pixel cells convert incident light energy into corresponding electrical signals that can be processed and measured. In particular, U.S. Pat. No. 5,324,958 to Mead, et al. discloses a pixel cell structure formed from a bipolar phototransistor. A cross-section of this conventional pixel cell structure is shown in FIG. 1.

Conventional NPN bipolar phototransistor 10 is formed within N type well 12 present within lightly doped P type substrate 14. N well 12 serves as the collector of bipolar transistor 10. Lightly doped P type region 16 is created inside N well 12 and serves as the base of bipolar phototransistor 10. Heavily doped N type region 18 is created within lightly P doped type base 16 and serves as the emitter of bipolar transistor 10. Electrically active base 16, emitter 18, and collector 12 regions of conventional pixel cell 10 are isolated from adjacent pixel cells by field oxide structures 20. Thin oxide layer 22 is formed over field oxide 20 and lightly doped P type base 16. Thin oxide layer 22 acts as the dielectric layer of a capacitor having polysilicon 24 and base 16 as plates. In this manner, polysilicon layer 24 is capacitively coupled with base 16 through thin oxide layer 22, and drives base 16. Polysilicon layer 24 also serves as a portion of a row-select line. Emitter contact 26 (typically aluminum metal) is formed on top of heavily doped N type emitter region 18 and is in electrical communication with a column-sense line (not shown). N well 12 is in electrical communication with a positive supply voltage (not shown).

Under normal operation, a charge generated by light incident on the surface of the pixel cell collects during an integration time period, and is subsequently read out to indicate the intensity of the incident light. Specifically, photons 28 incident on the surface of pixel cell 10 pass though polysilicon layer 24 and enter lightly doped P type base 16 during an integration time period. These incident photons generate electron/hole pairs within lightly doped P type base 16.

Polysilicon 24 is maintained at a relatively low voltage during the integration time period. Because base 16 is capacitively coupled with polysilicon 24, base 16 is maintained at a relatively low base voltage during the integration time period, so that holes generated by the passage of incident photons collect in base 16. Electrons generated by the impact of incident photons drift away to N type emitter region 18 or collector region 12.

At the conclusion of the integration period, the voltage applied to polysilicon 24 is increased. The corresponding positive voltage change that is communicated to base 16 through thin oxide 22 permits current to flow from base 16 into emitter 18. Thus, holes that have collected in base 16 during the integration period, multiplied by the current gain of bipolar transistor 10, flow from base 16 into emitter 18. This flow of holes is output through emitter contact 26 onto the column-sense line, and can be detected to determine the quantity of incident photons.

Figure 2:
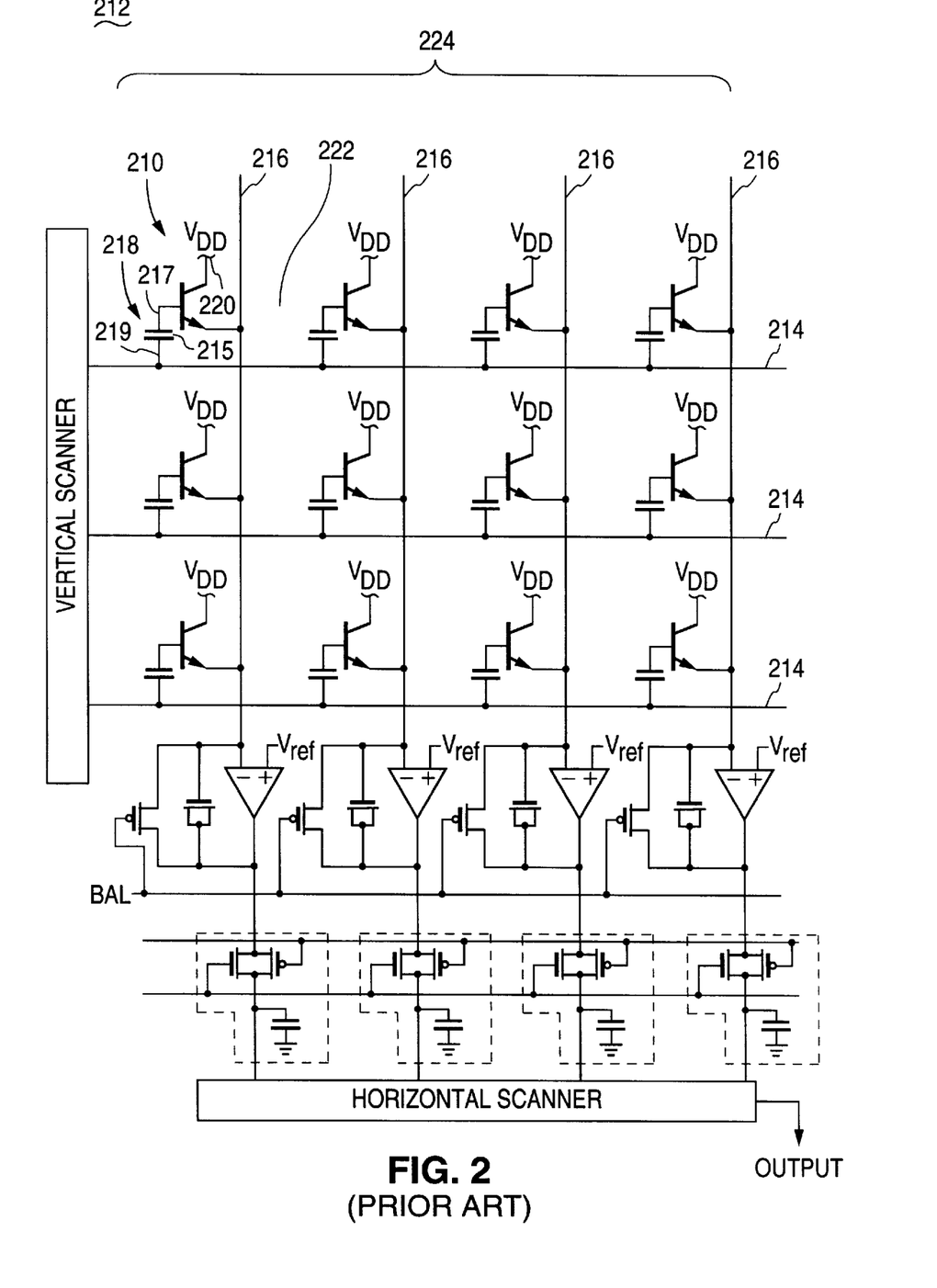
FIG. 2 shows a circuit diagram for an array of conventional pixel cells making up an imaging device.

FIG. 2 shows an array 224 of conventional pixel cells 210 forming part of imaging device 212. Rows of individual pixel cells 210 share common row select lines 214, and columns of individual pixel cells 210 share common column-sense lines 216. The thin oxide layer 215 between the base 217 and the polysilicon 219 functions as the dielectric layer of a capacitor 218. The collector region underlying the pixel cells is connected to a positive supply voltage 220. Field oxide structures 222 are present in the inter-pixel regions. The electrical isolation provided by field oxide structures 222 ensures that operation of each pixel cell 210 is unaffected by electrical fields generated by nearby pixel cells.

While functional, pixel cell 10 shown in FIG. 1 and pixel cell array 224 shown in FIG. 2 suffer from a number of disadvantages.

A first disadvantage associated with conventional pixel cell 10 is unwanted formation of an inversion layer in base 16 at a depth below the interface with thin oxide 22.

Base 16 is conventionally formed by implanting dopant into the silicon prior to the formation of polysilicon 24. Subsequently, thin oxide 22 and polysilicon 24 are created on top of base 16, and emitter region 18 is formed within base 16 by high dosage, low-energy implant of conductivity-altering dopant of a type opposite that of the base.

Figure 3A:
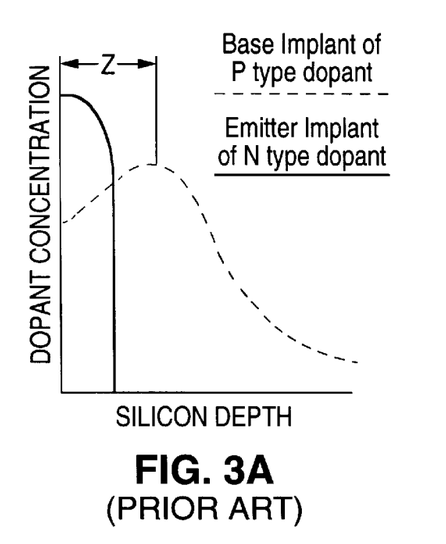
FIG. 3A plots dopant concentration versus depth below the silicon surface in the emitter region, resulting from high energy implantation of P type dopant prior to the formation of polysilicon.

FIG. 3A plots dopant concentration versus depth below the silicon surface in the emitter region, resulting from high energy implantation of P type dopant prior to the formation of polysilicon. FIG. 3A reveals that high energy implantation of P type dopant to form the base, results in highest P type dopant concentration lying at a depth Z below the silicon surface. The dopant profile shown in FIG. 3A is advantageous for pixel cell device 10 because 1) regions shallower than Z contain less P type dopant, and are thus available to receive concentrated N type dopant to form the emitter; 2) the P type dopant extends deeply into the silicon, and thereby isolates the emitter region; and 3) the interface between highest N and P type dopant levels is abrupt and clearly defined, allowing for optimum P/N junction performance.

Figure 3B:
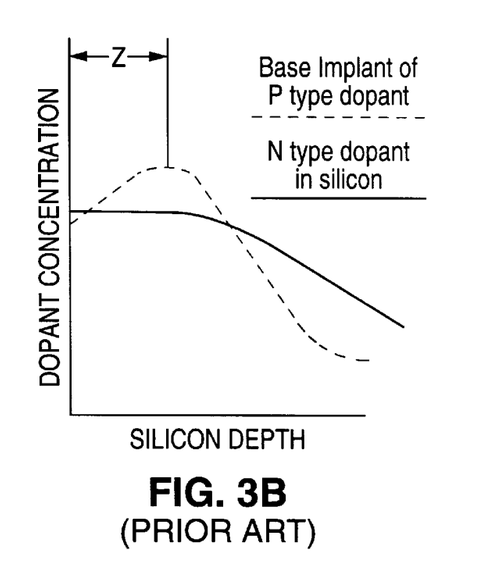
FIG. 3B plots dopant concentration versus depth below the silicon surface in the base region underlying the thin oxide, resulting from high energy implantation of P type dopant prior to the formation of polysilicon.

Unfortunately, formation of base 16 by high energy implant prior to the formation of polysilicon may cause an inversion layer to form underneath the thin oxide layer 22. FIG. 3B plots dopant concentration versus depth below the silicon surface in the base region underlying the thin oxide, resulting from high energy implantation of P type dopant prior to the formation of polysilicon. As with FIG. 3A, FIG. 3B reveals that high energy implantation creates highest P type dopant concentrations at a depth Z below the surface of the silicon. However, optimum capacitive coupling between base 16 and polysilicon 24 of NPN bipolar phototransistor 10 occurs where silicon in base 16 immediately beneath thin oxide 22 operates in a state of accumulation, wherein majority carriers are plentiful and are able to gather at a minimum distance from polysilicon 24. In NPN bipolar phototransistor 10, holes are the majority carriers in base 16, and must encounter P type dopant at the thin oxide interface in order to ensure optimal capacitive coupling between base 16 and polysilicon 24.

Unfortunately however, FIG. 3B reveals that high energy implant of P type dopant creates the most concentrated level of P type dopant at a depth Z below the surface of the silicon. Having the dopant concentrated at a depth Z below the surface leaves insufficient doping near the surface, such that the majority carriers easily become depleted near the surface. This state of depletion, as opposed to the state of accumulation in which carriers are plentiful, reduces the capacitive coupling between base 16 and polysilicon 24. If the dopant concentration of the base implant is very low relative to the collector dopant concentration near the surface, it is even possible, for sufficiently high voltage on polysilicon 24, for the surface area to be in a state of inversion, in which minority carriers are drawn into the surface region and cause unwanted conduction between the nearby regions of the other conductivity type, i.e., between collector and emitter.

Figure 3C:
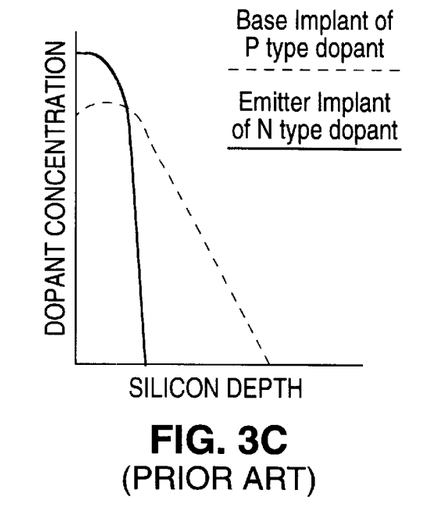
FIG. 3C plots dopant concentration versus depth below the silicon surface in the emitter region, resulting from low energy implantation of P type dopant prior to the formation of polysilicon.
Figure 3D:
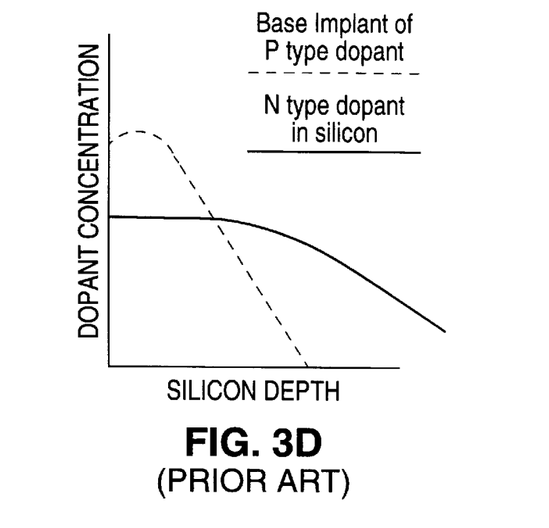
FIG. 3D plots dopant concentration versus depth below the silicon surface in the base region underlying the thin oxide, resulting from low energy implantation of P type dopant prior to the formation of polysilicon.

FIG. 3C plots dopant concentration versus depth below the silicon surface in the emitter region, resulting from the alternative prior art method of low energy implantation of P type dopant to form the base prior to the formation of polysilicon. FIG. 3D plots dopant concentration versus depth below the silicon surface in the base region underlying the thin oxide, resulting from low energy implantation of P type dopant to form the base prior to the formation of polysilicon.

FIG. 3D indicates that utilization of a low energy implant no longer creates a depletion or inversion region, as P type dopant concentrations in base 16 are sufficiently high at the thin oxide interface.

Unfortunately however, FIG. 3C reveals that low energy implantation of P type dopant to form base 16 places the highest concentration of P type dopant at a relatively shallow depth that may later lie within the emitter. The dopant profile shown in FIG. 3C forces the subsequent N type emitter implant to overcome these high levels of P type dopant, and also blurs the P/N junction, resulting in less efficient operation of the base and emitter of bipolar phototransistor 10. Low energy implant of P type dopant as shown in FIGS. 3C and 3D also makes the overall base region more shallow, resulting in less effective isolation of the emitter region from the underlying collector.

Therefore, it is desirable to fabricate a bipolar phototransistor having a base dopant profile that incorporates the best features of the high energy implant shown in FIG. 3A near the emitter, and the best features of the low energy implant shown in FIG. 3D in the region outside the emitter under the thin oxide.

Figure 4:
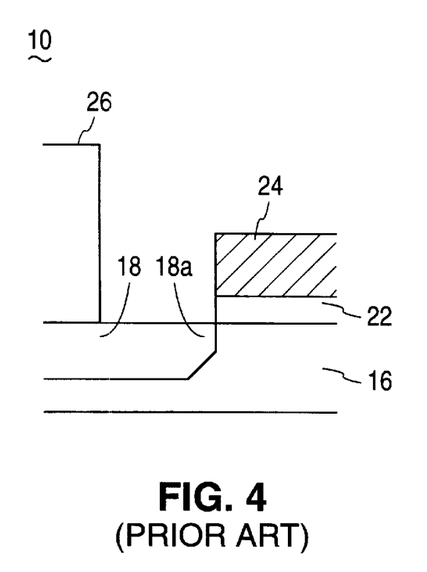
FIG. 4 shows an enlarged view of the junction between the emitter and the base of a conventional NPN bipolar phototransistor pixel cell.

A second disadvantage associated with conventional pixel cell 10 is leakage of current at the edge of emitter region 18. FIG. 4 shows an enlarged view of the junction between emitter region 18 and base 16 of conventional NPN bipolar phototransistor pixel cell 10. During operation of pixel cell 10, relatively high voltages are present at both heavily doped N type emitter region 18 and polysilicon 24. Edge 18a of the emitter region 18 adjacent to polysilicon 24 is therefore subjected to particularly high electric fields. As a result of these intense electric fields, leakage can occur between edge 18a of N+ emitter region 18, and polysilicon 24.

Therefore, it is desirable to design a pixel cell wherein the size of the heavily doped portion of the emitter region is reduced, increasing the distance between the edge of the emitter and adjacent polysilicon and thereby suppressing leakage between these points.

Figure 5:
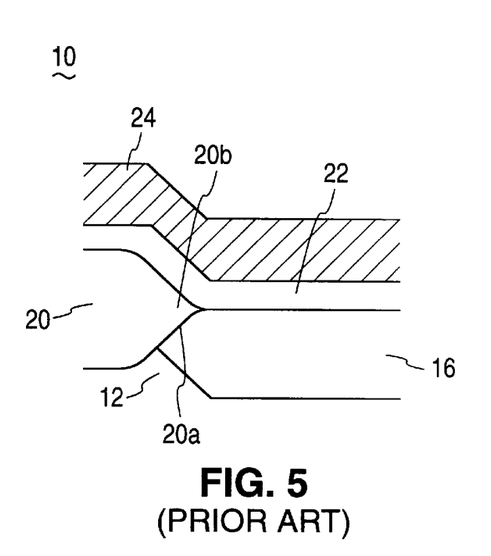
FIG. 5 shows an enlarged view of the interface between the base and the field oxide of a conventional NPN bipolar phototransistor pixel cell.

A third disadvantage associated with conventional NPN bipolar phototransistor pixel cell 10 is leakage of current at the field oxide interface. FIG. 5 shows an enlarged view of the interface between base 16 and field oxide 20 of conventional pixel cell 10.

While field oxide 20 is relatively thick in most places, edge 20a of the field oxide 20 thins to a narrow and relatively fragile "bird's beak" structure 20b. Formation of "bird's beak" 20b is an inevitable result of conventional field oxide growth processes. However, because of the relatively small oxide thickness present at edge 20a of field oxide 20, region 20a is exposed to particularly high electric fields during the conventional operation of pixel cell 10. The relative fragility of bird's beak 20b renders this region especially vulnerable to leakage.

Therefore, it is desirable to create a pixel cell structure that eliminates the field oxide edge as a potential source of leakage.

A fourth disadvantage associated with conventional pixel cell 10 is high resistance occurring at the point of contact between the pixel cell and the row-select and column-sense lines that link the pixel cell to the pixel cell array. Resistance of the polysilicon 24 may elevate the amount of voltage required on the row-select line in order to manipulate the pixel cell via capacitive coupling with the base, thereby needlessly subjecting the device to additional strain. Resistance between emitter contact 26 and the emitter region 18 may distort the integrity of the integration charge output to the column-sense line.

Therefore, it is desirable to design a pixel cell having low resistance contacts with the rows-select and column-sense lines.

SUMMARY OF THE INVENTION

The present invention relates to a bipolar phototransistor pixel cell and pixel cell array modified to improve performance. One improvement taught by the present invention is implantation of dopant into the silicon to form the base after formation of polysilicon, thereby causing highest base dopant concentrations to lie at both the thin oxide and the emitter interface. A second improvement taught by the present invention is reduction in size of the heavily doped portion of the emitter to extend no further than the footprint of the emitter contact, thereby suppressing leakage between the emitter and adjacent polysilicon. A third improvement taught by the present invention is electronic isolation of pixel cells within the array by forming inter-pixel regions doped with conductivity-altering impurity of a type opposite that of the base, rather than by forming field oxides, thereby eliminating leakage at the field oxide edge. A fourth improvement disclosed by the present invention is the introduction of silicides at the point of contact between the pixel cell and the column-sense and/or row-select lines, thereby reducing resistance at these points.

DETAILED DESCRIPTION

In the following description and claims, the terms N+, P+, nldd, and pldd refer to silicon regions created by these CMOS process steps, as would be understood by one of ordinary skill in the art. It will be understood that N+ and P+ are heavily doped regions, and that nldd and pldd are lightly-doped regions, relative to each other.

The present invention relates to bipolar phototransistor pixel cells and pixel cell arrays having one or more features that enhance performance. These features may be implemented into the pixel cell design singly or in various combinations as described in detail below.

1. Base Implant After Polysilicon Formation

In accordance with the first embodiment of the present invention, a bipolar phototransistor is formed by implanting dopant after the formation of the polysilicon. FIGS. 6A–6D show the process of formation of an NPN bipolar pixel cell 600 in accordance with the first embodiment of the present invention.

Figure 6A:
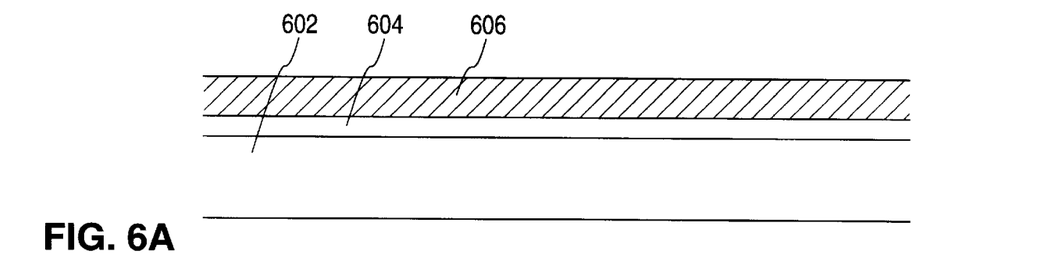
FIGS. 6A–6D show the steps for formation of an NPN bipolar phototransistor pixel cell in accordance with a first embodiment of the present invention.

FIG. 6A shows the first step in the fabrication of NPN bipolar phototransistor 600, wherein thin oxide layer 604 and polysilicon layer 606 are formed upon the surface of silicon 602. Silicon 602 will serve as the collector for bipolar phototransistor 600. Silicon 602 may either be an N type substrate, or may be an N well formed within a P type substrate.

Figure 6B:
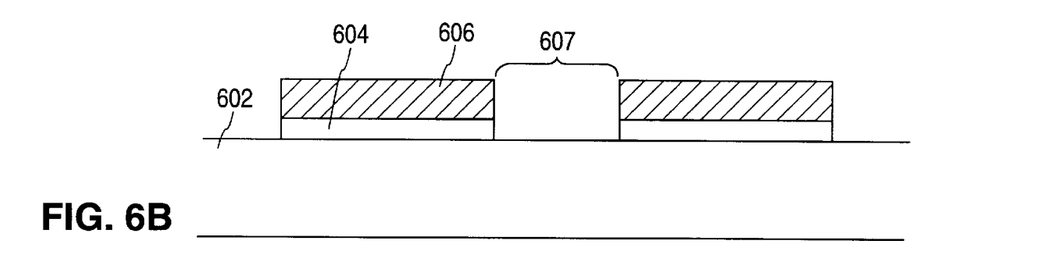

FIG. 6B shows the selective etching of thin oxide layer 604 and polysilicon layer 606 to form precursor emitter region 607.

Figure 6C:
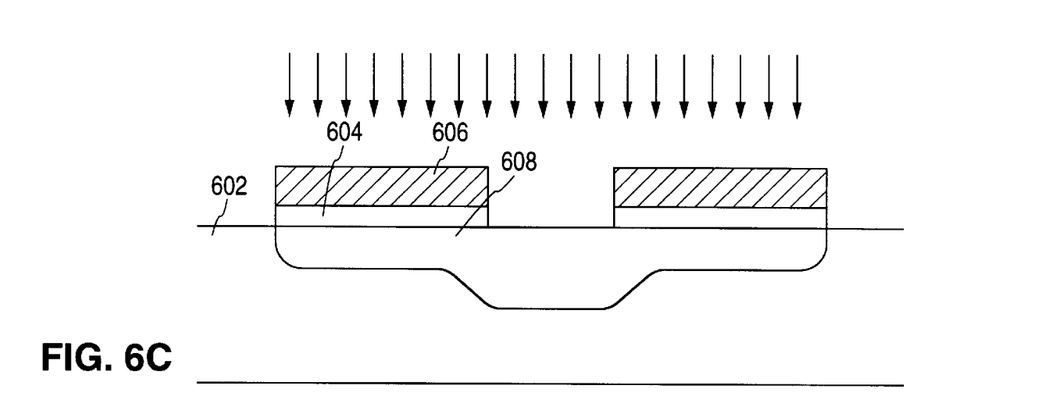

FIG. 6C shows the high energy implantation of P type dopant into silicon 602 to form the base 608 in accordance with the first embodiment of the present invention. Where thin oxide layer 604 and polysilicon layer 606 are present, these layers impede the passage of implanted P type dopant. Therefore, where P type dopant forming base 608 must travel through both polysilicon 606 and thin oxide layer 604 before reaching base 608, the highest concentration of P type dopant lies at a shallower depth than where P type dopant is implanted directly into the silicon.

Figure 6D:
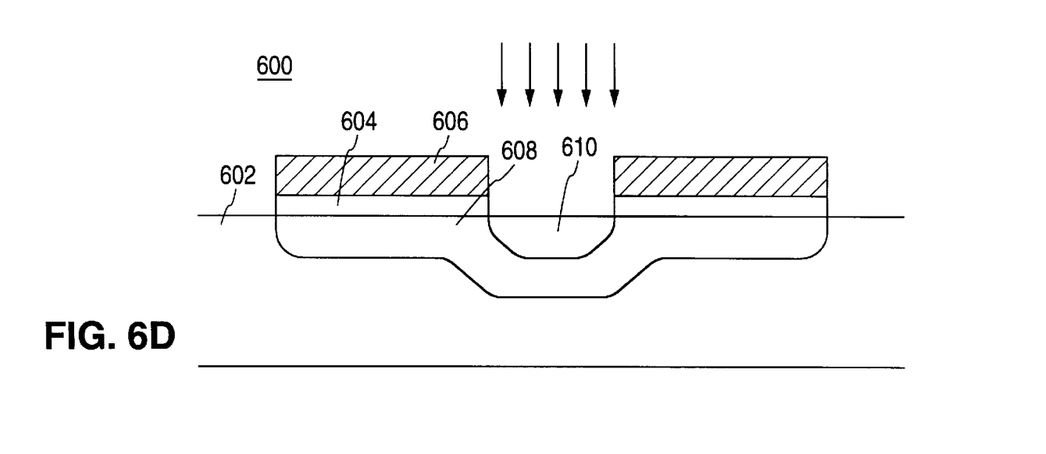

FIG. 6D shows the subsequent low energy implantation of N type dopant into precursor emitter region 607 to form the emitter 610.

Figure 7A:
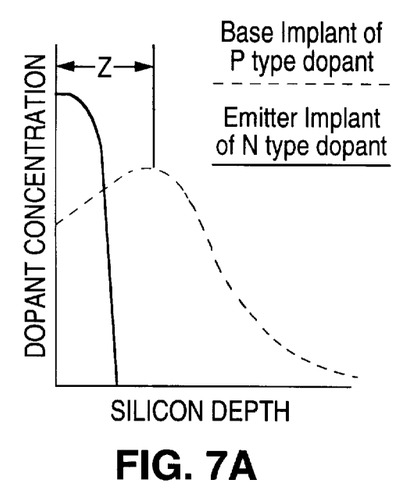
FIG. 7A plots dopant concentration versus depth below the silicon surface in the emitter region, resulting from high energy implantation of P type dopant after the formation of polysilicon.

FIG. 7A, similar to FIG. 3A, plots dopant concentration versus depth below the silicon surface in the emitter region, resulting from high energy implantation of P type dopant after formation of polysilicon. Because the implantation of P type dopant is unimpeded by an overlying polysilicon layer, highest concentrations of P type dopant lie at a depth Z below the silicon surface. This dopant profile accommodates the subsequent low energy implantation of N type dopant in shallower regions to form the emitter.

Figure 7B:
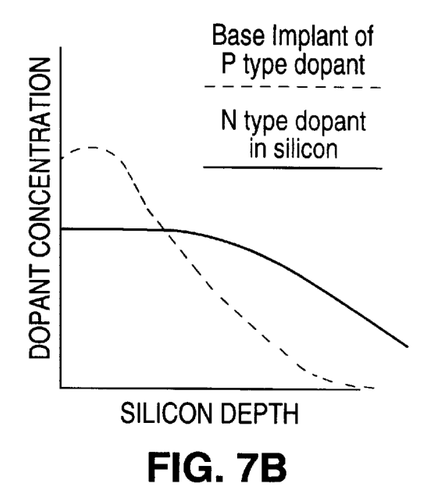
FIG. 7B plots dopant concentration versus depth below the silicon surface in the base region underlying the thin oxide, resulting from the high energy implantation of P type dopant after the formation of polysilicon.

FIG. 7B, similar to FIG. 3D, plots dopant concentration versus depth below the silicon surface in the base region underlying the thin oxide, resulting from high energy implantation of P type dopant after the formation of polysilicon. Because the implantation of P type dopant is impeded by the overlying polysilicon layer, highest concentrations of P type dopant lie at the silicon surface along the thin oxide interface.

Formation of a bipolar phototransistor in accordance with the first embodiment of the present invention inhibits the formation of an inversion layer under the thin oxide, because a first band of concentrated base dopant lies along the base-thin oxide interface, allowing the silicon in this region to operate in accumulation mode and permit holes to gather at a minimum distance from the polysilicon. The process in accordance with the first embodiment of the present invention also yields a second concentrated band of P type dopant at a depth in the base that will lie along the emitter interface when the emitter is formed, thereby ensuring formation of a base/emitter junction having optimal performance.

2. Reduction in Size of Emitter

In accordance with a second embodiment of the present invention, the heavily doped portion of the emitter of a conventional bipolar phototransistor is reduced in size so as to extend approximately no further than the footprint of the emitter contact.

Conventionally, the emitter region of an NPN bipolar transistor pixel cell is the product of an original nldd implant, followed by an N+ implant of the same dimensions as the nldd implant.

In accordance with the second embodiment of the N present invention, the emitter region is reshaped such that a smaller N+ region is formed in the center portion of the nldd regions. The N+ region is coextensive with the footprint of the emitter contact, and is surrounded by the nldd region which extends to the edge of the surrounding polysilicon. By modifying the configuration of the emitter region in this manner, distance between the N+ region of the emitter and the polysilicon is increased. Greater spacing between the heavily doped emitter region and the polysilicon inhibits unwanted leakage between these elements.

Figure 8:
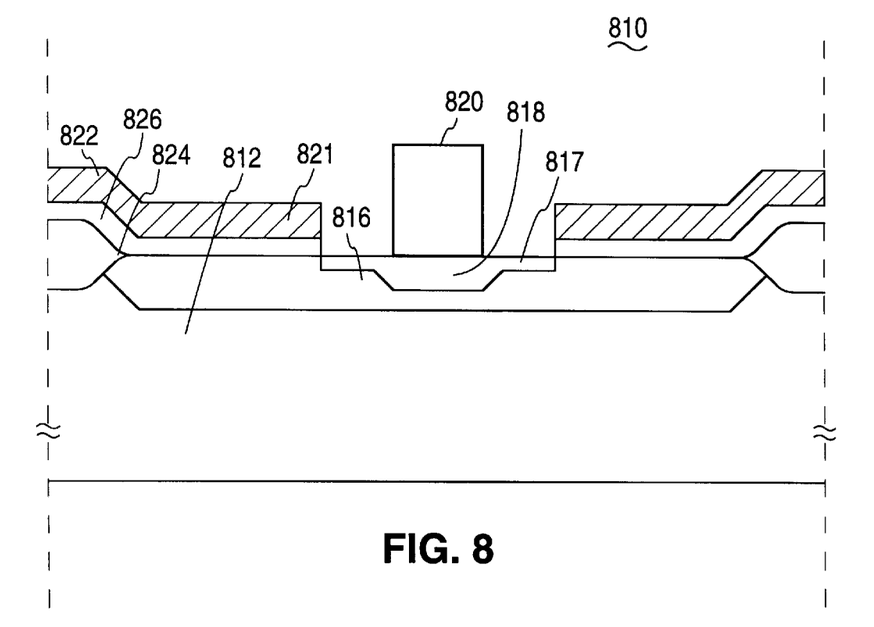
FIG. 8 shows a cross-sectional view of an NPN bipolar phototransistor pixel cell in accordance with a second embodiment of the present invention.

FIG. 8 shows a cross-sectional view of an NPN bipolar phototransistor forming pixel cell 810 in accordance with a second embodiment of the present invention. Bipolar phototransistor 810 is formed within lightly doped N type silicon 812. Lightly doped N type silicon 812 may be either a lightly doped substrate, or an N type well formed within a P type substrate. N type silicon 812 serves as the collector of NPN bipolar phototransistor 810. Lightly doped P type region 816 within N type silicon 812 serves as the base of NPN bipolar phototransistor 810. The emitter of NPN bipolar phototransistor 810 is initially defined as nldd region 817 within base 816. Subsequently, N+ type region 818 is formed inside nldd region 817.

As in conventional NPN bipolar phototransistor pixel cell 10, collector region 812 is in electrical communication with a positive supply voltage (not shown) that provides a collector voltage. Base 816 is capacitively coupled with polysilicon 821, which forms part of the row select line 822 running over the silicon surface. Electrically active pixel cell 810 is isolated by surrounding field oxide structures 824. Thin oxide layer 826 lies atop of base 816.

Unlike conventional pixel cell 10 however, N+ region 818 of bipolar phototransistor 810 is reduced in size so as to be only coextensive with emitter contact 820. In this manner, the distance between N+ region 818 and polysilicon 821 is increased, and leakage between these regions is suppressed.

3. Elimination of Field Oxide

In accordance with a third embodiment of the present invention, individual pixel cells formed within a silicon substrate are isolated from one another by regions containing conductivity-altering dopant rather than by field oxides.

Figure 9:
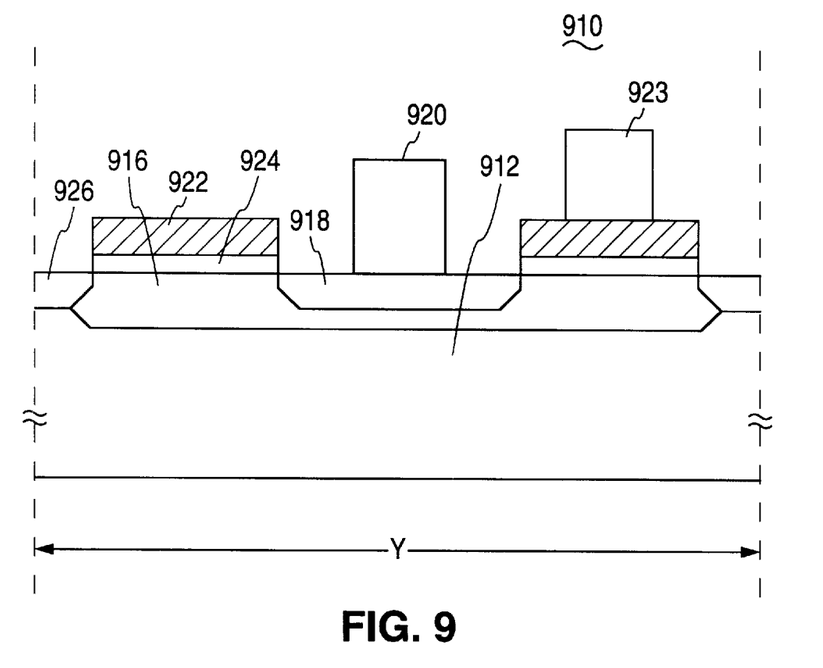
FIG. 9 shows a cross-sectional view of an NPN bipolar phototransistor pixel cell in accordance with a third embodiment of the present invention.

FIG. 9 shows a cross-sectional view of an NPN bipolar phototransistor forming pixel cell 910 in accordance with the third embodiment. NPN bipolar phototransistor pixel cell 910 is formed within lightly doped N type silicon 912. Lightly doped N type silicon 912 may be either a lightly doped N type substrate, or an N well formed within a P type substrate. Lightly doped N type silicon 912 serves as the collector of bipolar phototransistor 910. Lightly doped P type region 916, formed within lightly doped N type silicon 912, serves as the base of bipolar phototransistor 910. Heavily doped N type region 918, formed within base 916, serves as the emitter of bipolar phototransistor 910.

As with conventional NPN bipolar phototransistor 10 of FIG. 1, the collector region 912 is in electrical communication with a positive supply voltage (not shown) that supplies a collector voltage. Electrically conducting emitter contact 920 is formed on top of heavily doped emitter region 918. Lightly doped base 916 is capacitively coupled with polysilicon 922 through a thin oxide layer 924.

However, unlike conventional pixel cell 10, electrical isolation of pixel cell 910 is accomplished by forming N doped isolation regions 926 within lightly doped N type silicon 912. As a result, thin oxide layer 924 is only coextensive with the dimensions of base 916. Polysilicon 922 is in electrical communication with a row-select line through base capacitor contact 923.

Several important advantages are offered by the pixel cell structure in accordance with the third embodiment of the present invention. A first advantage is that each pixel cell 910 occupies a smaller surface area within the array, allowing for a greater pixel cell density. This is because N doped inter-pixel isolation regions 926 of pixel cell 910 occupy substantially less space than corresponding conventional field oxide isolation structures.

Specifically, the requisite width of N doped isolation region 926 is merely minimum poly to poly space, or $0.5\mu$. By contrast, physical requirements for growth of field oxides require a minimum interpixel spacing of $1\mu$. Thus, width X of conventional pixel cell 10 is approximately $4.3\mu$, while width Y of pixel cell 910 is approximately $3.8\mu$. The per-pixel space saving of $0.5\mu$ is amplified by corresponding reduction in pixel cell spacing in both the horizontal and vertical directions.

Given that the active surface area of a pixel cell is approximately $3.5\mu$ regardless of the form of electronic isolation, the invention in accordance with the present invention poses a potential savings in surface area of approximately 20%. Alternatively, the density of pixel cells can be maintained, while the coupling ratios of the pixel cells is increased.

A second advantage offered by pixel cell 910 in accordance with the third embodiment of the present is enhanced sensitivity to blue light. One important factor limiting pixel cell responsiveness is a differing sensitivity to photons over a spectrum of incident wavelengths. Both polysilicon and oxides present within the pixel cell block photons in the blue region of the spectrum from reaching the base to a greater extent than photons in the red region of the spectrum are blocked. Therefore, pixel cells having large areas of polysilicon or oxides on top of photosensitive regions generally have greater sensitivity to red light than to blue light. This imbalance can result in a pixel cell generating an integration voltage not truly representative of the quantity of incident light.

Comparison of conventional pixel cell 10 with pixel cell 910 reveals that pixel cell 910 will have a truer red/blue response. This is because non-photosensitive field oxides 20 of conventional pixel cell 10 have been replaced by photosensitive N doped inter-pixel isolation regions 926 in pixel cell 910. While N doped inter-pixel regions 926 serve primarily to isolate pixel cell 910, N doped inter-pixel regions 926 also generate electron-hole pairs in response to both incident red and blue light, thereby partially correcting the sensitivity imbalance described above.

Figure 10:
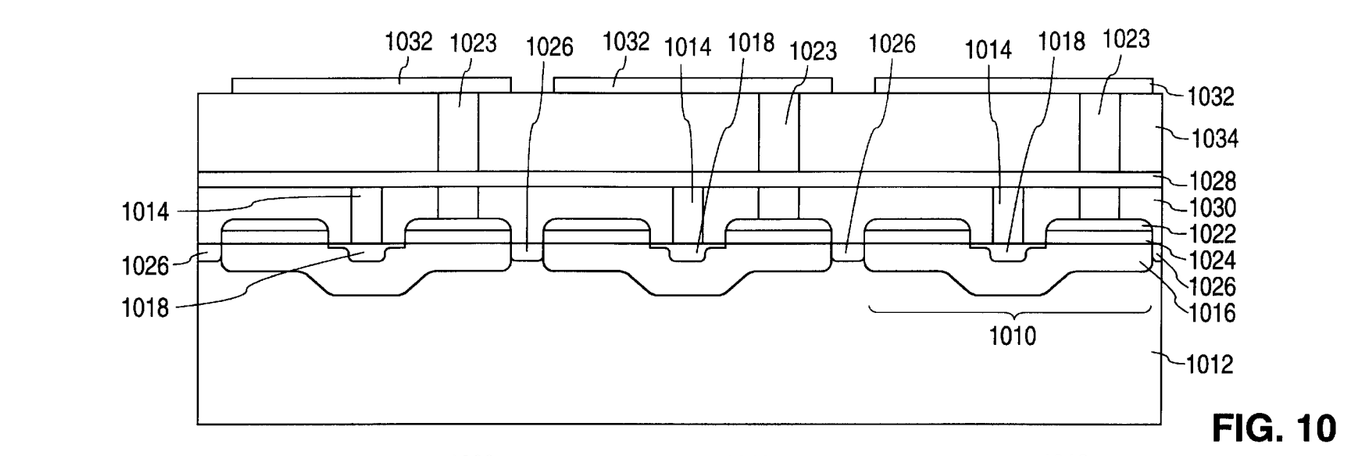
FIG. 10 shows a cross-sectional view, along a column-sense line, of an array of NPN bipolar phototransistor pixel cells in accordance with a fourth embodiment of the present invention.
Figure 11:
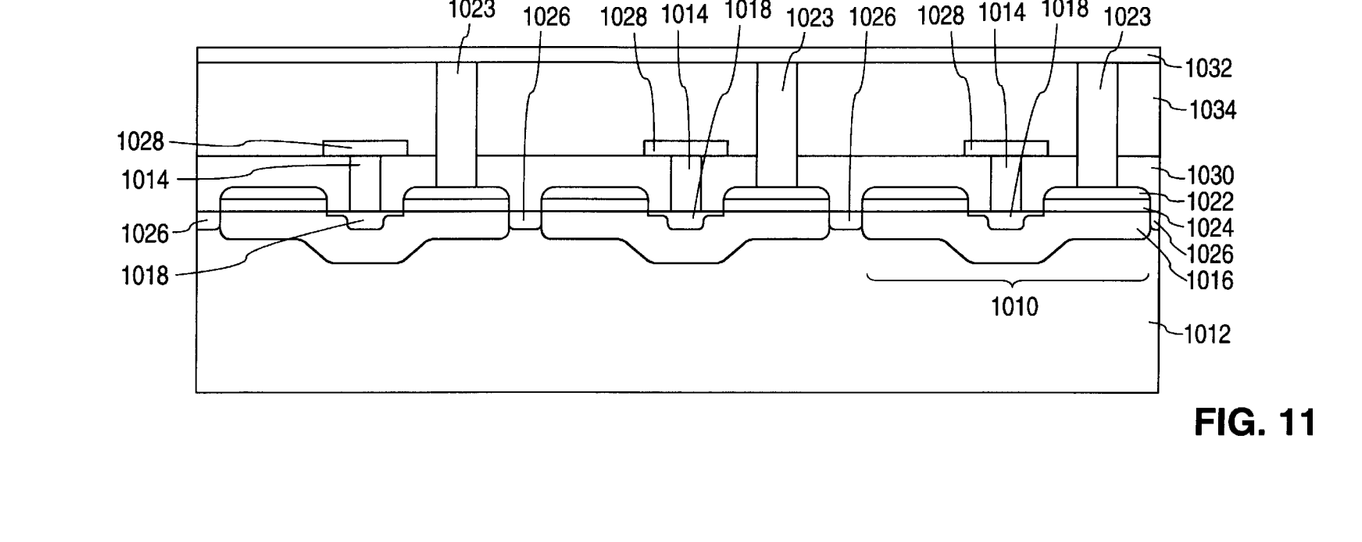
FIG. 11 shows a cross-sectional view, along a row select line, of the array of NPN bipolar phototransistor pixel cells in accordance with the fourth embodiment of the present invention.

FIG. 10 shows a cross-sectional view along a column-sense line 1028 of an array of NPN bipolar phototransistor pixel cells in accordance with a fourth embodiment of the present invention. FIG. 11 shows a cross-sectional view along a row select line 1032 of an array of NPN bipolar phototransistor pixel cells in accordance with the fourth embodiment of the present invention.

Pixel cell 1010 incorporates the advantages offered by the first, second, and third embodiments. Specifically, pixel cell 1010 includes a base region 1016 fabricated by implanting P type dopant through polysilicon 1022 and thin oxide 1024 to achieve the optimal base region dopant profile discussed above in connection with FIGS. 7A and 7B. Pixel cell 1010 also includes an emitter 1018 having an N+doped region that is reduced in size so as to be coextensive with the emitter contact 1014.

Pixel cell 1010 also includes the substitution of N doped inter-pixel silicon regions 1026 for conventional field oxides for isolation purposes.

FIGS. 10 and 11 show emitter 1018 and emitter contact 1014 in electrical communication with a first interconnect metallization layer 1028 forming a column-sense line. First interconnect metallization layer 1028 is isolated from the surface of the silicon by first intermetal dielectric layer 1030.

Field oxides are no longer present in pixel cell 1010, and direct contact between polysilicon 1022 and N doped inter-pixel isolation region 1026 would disrupt transmission of row-select signals. Therefore, rather than lying directly upon the silicon surface, the row-select line in communication with polysilicon 1022 by way of base capacitor contact 1023 is formed as a second interconnect metallization layer 1032. Second interconnect metallization layer 1032 is insulated from first interconnect metallization layer 1028 by second intermetal dielectric layer 1034.

4. Utilization of Silicided Contacts

Figure 12:
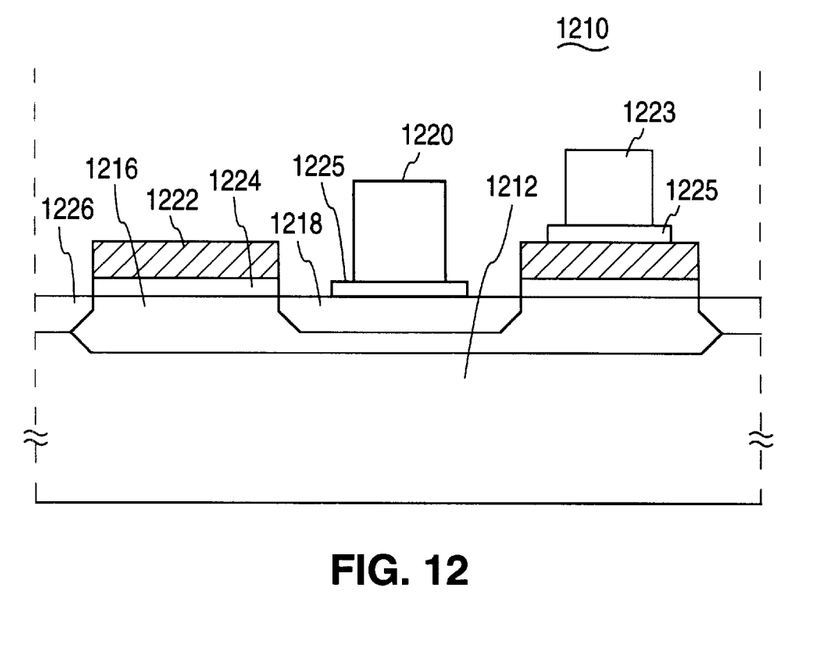
FIG. 12 shows a cross-sectional view of an NPN bipolar phototransistor pixel cell in accordance with a fifth embodiment of the present invention.

FIG. 12 shows a cross-sectional view of an NPN bipolar phototransistor forming pixel cell 1210 in accordance with a fifth embodiment of the present invention. NPN bipolar phototransistor pixel cell 1210 resembles NPN bipolar phototransistor pixel cell 910 shown in FIG. 9. Pixel cell 1210 is formed within lightly doped N type silicon 1212. Lightly doped N type silicon 1212 may be a lightly doped N type substrate, or an N type well formed within a lightly doped P type substrate.

N type silicon 1212 serves as the collector of NPN bipolar phototransistor 1210. Lightly doped P type region 1216 formed within N type silicon 1212 serves as the base of bipolar phototransistor 1210. Heavily doped N type region 1218, formed within base 1216, serves as the emitter of bipolar phototransistor 1210.

As with NPN bipolar phototransistor 910 of FIG. 9, collector region 1212 of pixel cell 1210 is in electrical communication with a positive supply voltage (not shown) that supplies a collector voltage. Electrically conducting emitter contact 1220 is formed on top of heavily doped emitter region 1218. Base 1216 is capacitively coupled with polysilicon 1222 through thin oxide layer 1224. Polysilicon 1222 is in electrical communication with a row-select line by way of base capacitor contact 1223.

Unlike pixel cell 910 however, pixel cell 1210 includes silicide 1225 where polysilicon 1222 meets base capacitor contact 1223, and also where emitter 1218 meets emitter contact 1220. Silicide 1225 effects a low resistance electrical connection between polysilicon 1222 and base capacitor contact 1223, and between emitter 1218 and emitter contact 1220.

Silicide 1225 may be formed by the reaction between silicon and a variety of refractory metals, including but not limited to titanium, cobalt, nickel, platinum, or palladium. While FIG. 12 depicts silicide 1225 as a separate layer on top of polysilicon 1222 and emitter 1218, silicide 1225 may also be formed as a separate region within polysilicon 1222 and/or emitter 1218.

Figure 13:
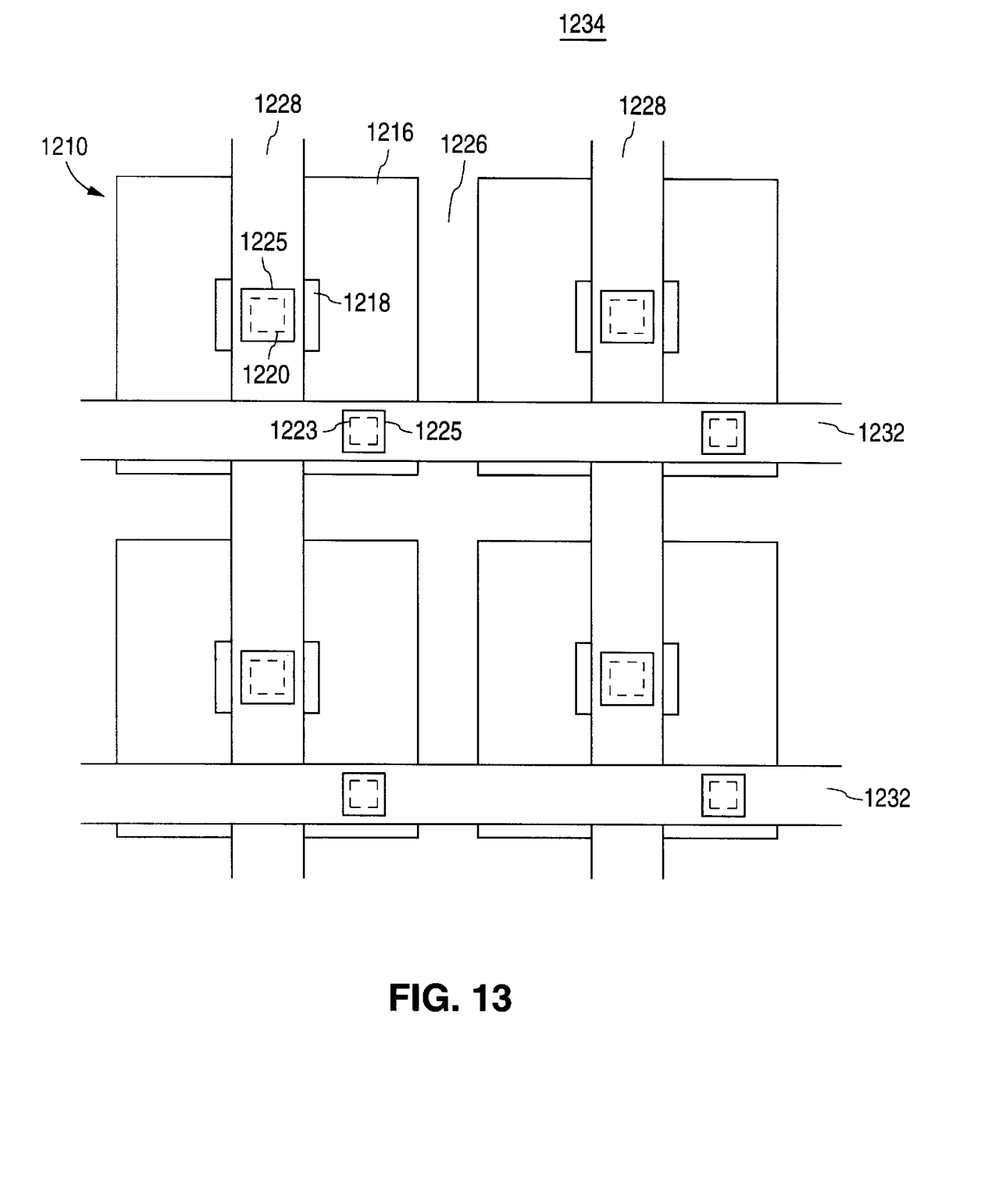
FIG. 13 shows a top view of an array of NPN bipolar phototransistor pixel cells in accordance with the fifth embodiment of the present invention.

FIG. 13 shows a top view of a portion of an array 1234 of NPN bipolar phototransistor pixel cells 1210 in accordance with the fifth embodiment of the present invention. Column-sense line 1228 of array 1234 is formed by a first interconnect metallization layer. Row-select line 1232 is formed by a second interconnect metallization layer.

While the various features of the present invention have been illustrated with regard to a pixel cell consisting of an NPN bipolar phototransistor, the invention is applicable to other photosensitive structures as well.

For example, while the first embodiment of the present invention is illustrated by implantation of P type dopant through thin oxide and polysilicon layers to form a P type base, the present invention is equally applicable to alter the base dopant profile of a PNP bipolar phototransistor. And, while the second embodiment of the present invention is illustrated by the reduction in size of the N+ emitter region of an NPN bipolar phototransistor, the present invention is equally applicable to reduce leakage in corresponding PNP bipolar phototransistors. Of course, in both of the PNP embodiments cited above the phototransistor structure would have relative voltages and conductivity types reversed as compared with the NPN bipolar phototransistor embodiments described in connection with FIGS. 7–13.

Moreover, replacement of field oxide isolation structures with N doped implants as described in conjunction with the third embodiment of the present invention is not limited to NPN bipolar phototransistor pixel cells. The present invention is equally applicable to arrays of pixel cells composed of other light-detecting structures, including but not limited to, MOSFET devices and PNP bipolar phototransistors.

The various embodiments of the present invention should generally be viewed as being complementary rather than exclusive. Thus, a pixel cell in accordance with the present invention could be fabricated combining all or some of the features described. However, it is important to note that utilization of a silicided emitter contact in accordance with the fifth embodiment is incompatible with reduction in the size of the emitter in accordance with the second embodiment. This is because fabrication of silicide having a narrower width than the already reduced heavily doped emitter region would be precluded by physical constraints.

Therefore, it is intended that the following claims define the scope of the invention, and that methods and structures falling within the scope of these claims and their equivalents be covered thereby.

What is claimed is:

1. A bipolar phototransistor pixel cell comprising:

a collector region of a first conductivity type having a collector surface;

a base region of a second conductivity type opposite the first conductivity type, having a base surface and bordered on all sides except the base surface by the collector region;

an emitter region of the first conductivity type having an emitter surface and bordered on all sides except the emitter surface by the base region;

a thin oxide layer formed on top of the collector surface and the base surface; and a polysilicon layer formed on top of the thin oxide layer, wherein implantation of dopant of the second conductivity type through the thin oxide layer and the polysilicon to form the base region produces a first band of concentrated dopant located directly beneath the thin oxide layer and a second band of concentrated dopant located at a depth below the base surface and adjacent to the emitter region.

2. The pixel cell according to claim 1 wherein the emitter region further comprises a heavily doped emitter region having a heavily doped emitter surface bordered on all sides except for the heavily doped emitter surface by a lightly doped emitter region, and wherein the bipolar phototransistor pixel cell further comprises an emitter contact formed on top of the heavily doped emitter surface.

3. The pixel cell according to claim 1 further comprising a silicide layer on top of at least one of the emitter surface and the polysilicon.

4. A bipolar phototransistor pixel cell comprising:
a collector region of a first conductivity type having a collector surface;
a base region of a second conductivity type opposite the first conductivity type, having a base surface and bordered on all sides except the base surface by the collector region;
an emitter region including a heavily doped emitter region having a heavily doped emitter surface bordered on all sides except for the heavily doped emitter surface by a lightly doped emitter region;
an emitter contact formed on top of the heavily doped emitter surface;
a thin oxide layer formed on top of the collector surface and the base surface; and
a polysilicon layer formed on top of the thin oxide layer.

5. A bipolar phototransistor pixel cell comprising:
a collector region of a first conductivity type having a collector surface;
a base region of a second conductivity type opposite the first conductivity type, having a base surface and bordered on all sides except the base surface by the collector region;
an emitter region of the first conductivity type having an emitter surface and bordered on all sides except the emitter surface by the base region;
a thin oxide layer formed on top of the collector surface and the base surface;
a polysilicon layer formed on top of the thin oxide layer; and
a silicide layer formed on top of at least one of the emitter surface and the polysilicon layer.

6. A pixel cell array comprising a plurality of bipolar phototransistor pixel cells configured in rows and columns within a common collector region of a first conductivity type having a collector surface, the array including inter-pixel isolation regions of the first conductivity type formed within the common collector region between pixel cells, the pixel cells including,
a base region of a second conductivity type opposite the first conductivity type, having a base surface and bordered on all sides except the base surface by the collector region,
an emitter region of the first conductivity type having an emitter surface and bordered on all sides except the emitter surface by the base region,
a thin oxide layer formed on top of the collector surface and the base surface, and
a polysilicon layer formed on top of the thin oxide layer, wherein implantation of dopant of the second conductivity type through the thin oxide layer and the polysilicon to form the base region produces a first band of concentrated dopant located directly beneath the thin oxide layer and a second band of concentrated dopant located at a depth below the base surface and adjacent to the emitter region.

7. A pixel cell array according to claim 6 wherein:
the emitter region of the pixel cells further comprises a heavily doped emitter region having a heavily doped emitter surface bordered on all sides except for the heavily doped emitter surface by a lightly doped emitter region; and
wherein the pixel cells further comprise an emitter contact formed on top of the heavily doped emitter surface.

8. A pixel cell array according to claim 6 wherein the pixel cells further include a silicide layer on top of at least one of the emitter surface and the polysilicon.

9. A pixel cell array comprising a plurality of bipolar phototransistor pixel cells configured in rows and columns within a common collector region of a first conductivity type having a collector surface, the array including inter-pixel isolation regions of the first conductivity type formed within the common collector region between pixel cells, the pixel cells including,
a base region of a second conductivity type opposite the first conductivity type, having a base surface and bordered on all sides except the base surface by the collector region,
an emitter region including a heavily doped emitter region having a heavily doped emitter surface bordered on all sides except for the heavily doped emitter surface by a lightly doped emitter region,
an emitter contact formed on top of the heavily doped emitter surface,
a thin oxide layer formed on top of the collector surface and the base surface, and
a polysilicon layer formed on top of the thin oxide layer.

10. A pixel cell array comprising a plurality of bipolar phototransistor pixel cells configured in rows and columns within a common collector region of a first conductivity type having a collector surface, the array including inter-pixel isolation regions of the first conductivity type formed within the common collector region between pixel cells, the pixel cells including,
a base region of a second conductivity type opposite the first conductivity type, having a base surface and bordered on all sides except the base surface by the collector region;
an emitter region of the first conductivity type having an emitter surface and bordered on all sides except the emitter surface by the base region;
a thin oxide layer formed on top of the collector surface and the base surface;
a polysilicon layer formed on top of the thin oxide layer; and
a silicide layer formed on top of at least one of the emitter surface and the polysilicon layer.

* * * * *